(12) United States Patent
Iwamoto

(10) Patent No.: US 11,876,029 B2
(45) Date of Patent: Jan. 16, 2024

(54) METHOD OF MANUFACTURING ELECTRONIC COMPONENT MODULE, AND ELECTRONIC COMPONENT MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 209 days.

(21) Appl. No.: 17/395,574

(22) Filed: Aug. 6, 2021

(65) Prior Publication Data

US 2021/0366801 A1    Nov. 25, 2021

Related U.S. Application Data

(63) Continuation of application No. PCT/JP2020/005092, filed on Feb. 10, 2020.

(30) Foreign Application Priority Data

Feb. 14, 2019    (JP) .................................. 2019-024737

(51) Int. Cl.
*H01L 23/31*    (2006.01)
*H01L 21/48*    (2006.01)
(Continued)

(52) U.S. Cl.
CPC .......... *H01L 23/315* (2013.01); *H01L 21/486* (2013.01); *H01L 21/4857* (2013.01);
(Continued)

(58) Field of Classification Search
CPC . H01L 23/315; H01L 21/4857; H01L 21/486; H01L 21/565; H01L 23/49822;
(Continued)

(56) References Cited

U.S. PATENT DOCUMENTS

| 2008/0298023 A1 | 12/2008 | Okimoto et al. |
| 2013/0056867 A1* | 3/2013 | Pagaila ................ H01L 21/565 |
| | | 257/737 |

(Continued)

FOREIGN PATENT DOCUMENTS

| JP | 2001-110988 A | 4/2001 |
| JP | 2008-186987 A | 8/2008 |

(Continued)

OTHER PUBLICATIONS

Official Communication issued in International Patent Application No. PCT/JP2020/005092, dated Apr. 21, 2020.

*Primary Examiner* — Selim U Ahmed
*Assistant Examiner* — Evan G Clinton
(74) *Attorney, Agent, or Firm* — Keating & Bennett, LLP

(57) ABSTRACT

A method of manufacturing an electronic component module includes a sacrificial-body arrangement step of disposing a sacrificial body on a first principal surface of a support, the support including the first principal surface and a second principal surface, the sacrificial body being smaller than the first principal surface when viewed in a thickness direction of the support, a resin molding step of molding a resin structure on the first principal surface so as to cover the sacrificial body disposed on the first principal surface, a recess forming step of forming a recess in the resin structure by removing the sacrificial body, a wiring-layer forming step of forming a wiring layer on a side surface of the recess and on a principal surface of the resin structure, the principal surface connecting with the side surface, and a component mounting step of mounting an electronic component in the recess.

19 Claims, 7 Drawing Sheets

(51) Int. Cl.
*H01L 21/56* (2006.01)
*H01L 23/498* (2006.01)
*H01L 23/538* (2006.01)
*H01L 23/00* (2006.01)
*H01L 25/10* (2006.01)

(52) U.S. Cl.
CPC ...... *H01L 21/565* (2013.01); *H01L 23/49822* (2013.01); *H01L 23/49844* (2013.01); *H01L 23/5383* (2013.01); *H01L 23/5386* (2013.01); *H01L 24/24* (2013.01); *H01L 25/105* (2013.01); *H01L 2224/24137* (2013.01); *H01L 2224/24145* (2013.01)

(58) Field of Classification Search
CPC ........... H01L 23/49844; H01L 23/5383; H01L 23/5386; H01L 24/24; H01L 25/105; H01L 2224/24137; H01L 2224/24145; H01L 24/16; H01L 24/81; H01L 25/03; H01L 25/165; H01L 23/49816; H01L 2221/68345; H01L 2221/68359; H01L 2224/81801; H01L 21/6835; H01L 23/50; H01L 23/13; H01L 2224/16225; H01L 2924/181; H01L 2924/19105; H01L 21/56; H05K 3/46

See application file for complete search history.

(56) References Cited

U.S. PATENT DOCUMENTS

| | | | |
|---|---|---|---|
| 2014/0264808 A1* | 9/2014 | Wolter | H01L 23/3128 257/774 |
| 2015/0035528 A1 | 2/2015 | Nishioka et al. | |
| 2016/0358848 A1 | 12/2016 | Meyer et al. | |
| 2017/0317000 A1 | 11/2017 | Nishimura | |

FOREIGN PATENT DOCUMENTS

| | | |
|---|---|---|
| JP | 2009-010358 A | 1/2009 |
| JP | 2009-188144 A | 8/2009 |
| JP | 2010/141282 A | 6/2010 |
| JP | 2015-053465 A | 3/2015 |
| JP | 2017-508296 A | 3/2017 |
| JP | 2017-201659 A | 11/2017 |

* cited by examiner

METHOD OF MANUFACTURING ELECTRONIC COMPONENT MODULE, AND ELECTRONIC COMPONENT MODULE

CROSS REFERENCE TO RELATED APPLICATIONS

This application claims the benefit of priority to Japanese Patent Application No. 2019-024737 filed on Feb. 14, 2019 and is a Continuation Application of PCT Application No. PCT/JP2020/005092 filed on Feb. 10, 2020. The entire contents of each application are hereby incorporated herein by reference.

BACKGROUND OF THE INVENTION

1. Field of the Invention

The present invention relates to a method of manufacturing an electronic component module, and the electronic component module. More specifically, the present invention relates to a method of manufacturing an electronic component module including an electronic component and a resin structure, and also relates to the electronic component module.

2. Description of the Related Art

In the related art, component built-in substrates (electronic component modules) housing built-in components are known (for example, see Japanese Unexamined Patent Application Publication No. 2010-141282). The component built-in substrate described in Japanese Unexamined Patent Application Publication No. 2010-141282 includes a core substrate, an intermediate layer, and a surface layer. Each of the core substrate, the intermediate layer, and the surface layer is formed by laminating multiple resin sheets. The core substrate, the intermediate layer, and the surface layer are laminated in a batch in a state in which the layers are aligned with each other. In the component built-in substrate described in Japanese Unexamined Patent Application Publication No. 2010-141282, a built-in component (electronic component) is disposed in an opening portion (recess) which is formed by laminating the intermediate layer and the surface layer.

In the component built-in substrate described in Japanese Unexamined Patent Application Publication No. 2010-141282, for example, when a stress is applied to the built-in component disposed in the opening portion, some damage may occur at the interface between the intermediate layer and the surface layer.

SUMMARY OF THE INVENTION

Preferred embodiments of the present invention provide methods of manufacturing electronic component modules, and electronic component modules. In each of the methods and the electronic component modules, even when a stress is applied to an electronic component, the resin structure is difficult to break.

A method of manufacturing an electronic component module according to a preferred embodiment of the present invention includes a sacrificial-body arrangement step of disposing a sacrificial body on a first principal surface of a support, the support including the first principal surface and a second principal surface, the sacrificial body being smaller than the first principal surface when viewed in a thickness direction of the support, a resin molding step of molding a resin structure on the first principal surface so as to cover the sacrificial body disposed on the first principal surface, a recess forming step of forming a recess in the resin structure by removing the sacrificial body, a wiring-layer forming step of forming a wiring layer on a side surface of the recess and on a principal surface of the resin structure, the principal surface connecting with the side surface, and a component mounting step of mounting an electronic component in the recess.

An electronic component module according to a preferred embodiment of the present invention includes a resin structure, an electronic component, and a wiring layer. The resin structure includes a principal surface in which a recess is disposed. The electronic component is disposed in the recess. The wiring layer is provided on the principal surface and on a side surface of the recess connecting with the principal surface, and is electrically connected to the electronic component.

Preferred embodiments of the present invention each have an effect that, even when a stress is applied to an electronic component, a resin structure is difficult to break.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
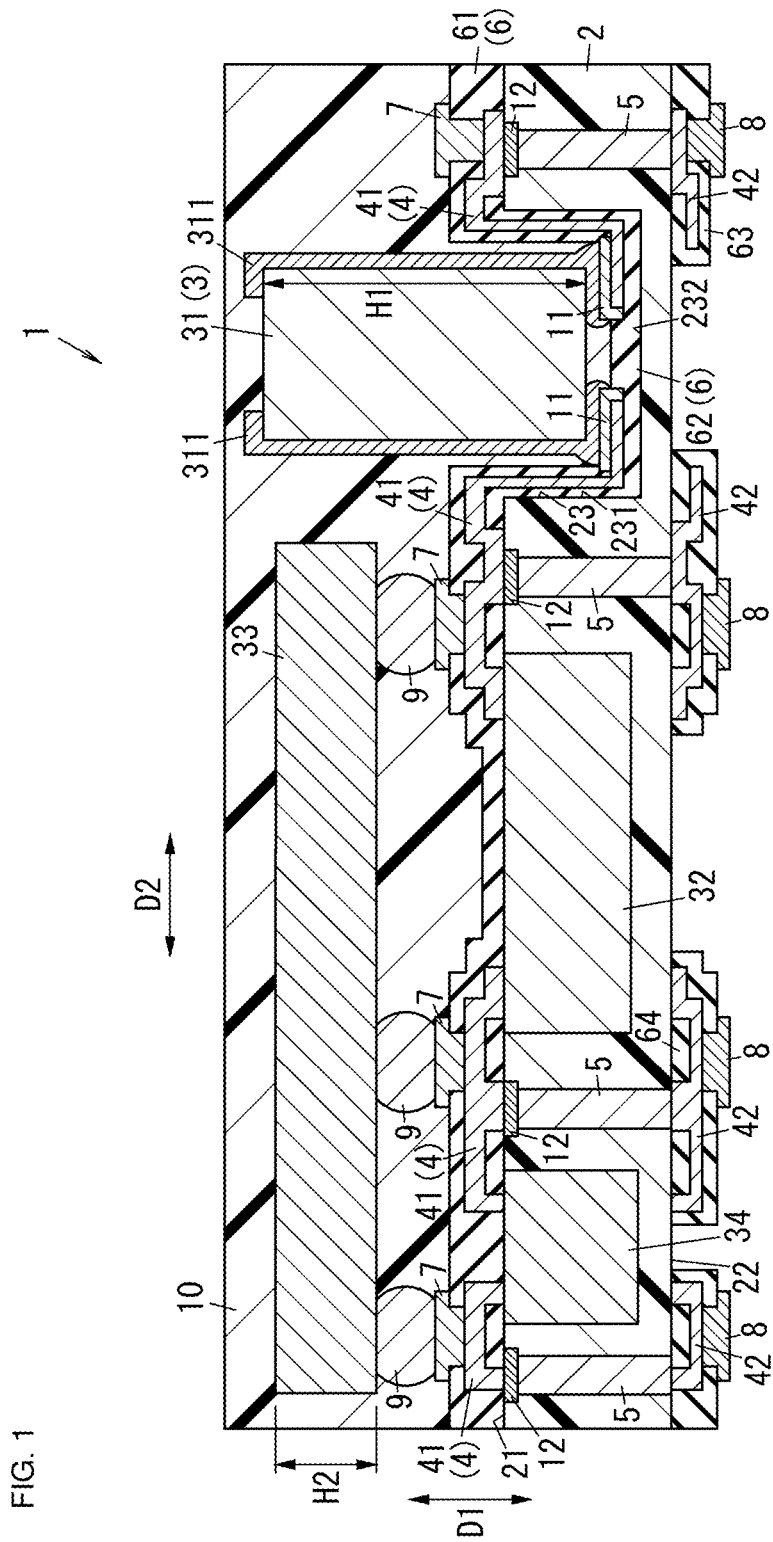
FIG. 1 is a sectional view of an electronic component module according to a preferred embodiment of the present invention.

Electronic component modules and methods of manufacturing electronic component modules according to preferred embodiments of the present invention will be described below by referring to the drawings. FIGS. 1 to 6 are schematic. The ratios of size or those of thickness of the components in the drawings do not necessarily reflect the actual dimensional ratios.

Preferred Embodiment

(1) The Entire Configuration of Electronic Component Module

The entire configuration of an electronic component module according to a preferred embodiment of the present invention will be described by referring to FIG. 1.

As illustrated in FIG. 1, an electronic component module 1 according to the present preferred embodiment includes a resin structure 2, a first electronic component 31 defining and functioning as an electronic component 3, and multiple first wiring layers 41 defining and functioning as a wiring layer 4. The resin structure 2 includes a first principal surface 21. A recess 23 is provided in the first principal surface 21. The first electronic component 31 is disposed in the recess 23. In the state in which the first electronic component 31 is disposed in the recess 23, the first electronic component 31 protrudes toward the opposite side (the upper side in FIG. 1) to the resin structure 2 with respect to the first principal surface 21 in the thickness direction D1 of the resin structure 2. In other words, the height H1 of the first electronic component 31 is greater than the height of the recess 23 in the thickness direction D1 of the resin structure 2. Among the first wiring layers 41, those corresponding to the first electronic component 31 are provided on the first principal surface 21 of the resin structure 2, on side surfaces 231 of the recess 23 which connect with the first principal surface 21, and on a bottom surface 232 of the recess 23. Among the first wiring layers 41, those corresponding to the first electronic component 31 are electrically connected to the first electronic component 31 through conductive portions 311 and conductive body portions 11 on the bottom surface 232 of the recess 23.

The electronic component module 1 according to the present preferred embodiment further includes multiple columnar electrodes 5, an insulating layer 6, a second electronic component 32, and a third electronic component 33. The columnar electrodes 5 extend through the resin structure 2 in the thickness direction D1 of the resin structure 2. The insulating layer 6 is provided on the first principal surface 21 of the resin structure 2, on the side surfaces 231 of the recess 23 which connect with the first principal surface 21, and on the bottom surface 232 of the recess 23. The second electronic component 32 is built in the resin structure 2 at a position at which the second electronic component does not overlap the first electronic component 31 in the thickness direction D1 of the resin structure 2. The third electronic component 33 is provided above the first principal surface 21 of the resin structure 2 so as not to overlap the first electronic component 31 in the thickness direction D1 of the resin structure 2. The second electronic component 32 and the third electronic component 33 are located in the thickness direction D1 of the resin structure 2 so that the third electronic component 33 covers the second electronic component 32 in the thickness direction D1 of the resin structure 2. The height H1 of the first electronic component 31 is greater than the height H2 of the third electronic component 33 in the thickness direction D1 of the resin structure 2.

The electronic component module 1 according to the present preferred embodiment further includes multiple first terminal electrodes 7 and multiple second terminal electrodes 8. Each of the first terminal electrodes 7 is electrically connected to the corresponding one of the first wiring layers 41 and the like. Each of the first terminal electrodes 7 is, for example, a UBM (Under Bump Metal). Each of the second terminal electrodes 8 is electrically connected to a corresponding one of multiple second wiring layers 42 and the like. Each of the second terminal electrodes 8 is, for example, a UBM.

(2) Components of the Electronic Component Module

The components of the electronic component module according to the present preferred embodiment will be described by referring to the drawing.

(2.1) The Resin Structure

As illustrated in FIG. 1, the resin structure 2 is a resin molded body which holds the first electronic component 31, the second electronic component 32, a fourth electronic component 34, and the columnar electrodes 5. The resin structure 2 is plate shaped. The resin structure 2 includes the first principal surface (principal surface) 21 and a second principal surface 22 which are opposite to each other in the thickness direction D1. The first principal surface 21 is opposite to the second principal surface 22. The outline of the resin structure 2 viewed in the thickness direction D1 of the resin structure 2 is rectangular or substantially rectangular, for example. This is not limiting. For example, the outline of the resin structure 2 may be square or substantially square. The size of the resin structure 2 viewed in the thickness direction D1 of the resin structure 2 is larger than the size of each of the first electronic component 31, the second electronic component 32, the third electronic component 33, and the fourth electronic component 34.

The resin structure 2 includes the recess 23. The recess 23 is a housing space for housing the first electronic component 31. The recess 23 includes the side surfaces 231 and the bottom surface 232. Each side surface 231 extends in the direction parallel or substantially parallel to the thickness direction D1 of the resin structure 2. The bottom surface 232 extends in the direction parallel or substantially parallel to the lengthwise direction D2 of the resin structure 2. The shape of the recess 23 viewed in the direction intersecting the thickness direction D1 of the resin structure 2 (the direction perpendicular or substantially perpendicular to the plane of FIG. 1) is rectangular or substantially rectangular. The recess 23 houses the first electronic component 31, thus achieving a reduction in profile of the electronic component module 1.

The resin structure 2 is made, for example, of electrically insulating resin. The resin structure 2 includes, for example, in addition to resin, a filler mixed into resin. However, a filler is not a necessary component. The resin is, for example, epoxy resin. Alternatively, the resin may be, for example, polyimide resin, acryl resin, urethane resin, silicone resin, or maleimide-based resin. The filler is, for example, an inorganic filler, such as silica or alumina. The resin structure 2 may include, in addition to resin and a filler, for example, black pigment such as carbon black.

(2.2) The Electronic Components

The first electronic component 31 is, for example, a rectangular or substantially rectangular electronic component which extends in the direction parallel or substantially parallel to the thickness direction D1 of the resin structure 2. The outline of the first electronic component 31 viewed in the thickness direction D1 of the resin structure 2 is rectangular or substantially rectangular, for example. This is not limiting. For example, the outline of the first electronic component 31 may be square or substantially square.

The second electronic component 32 is, for example, a chip electronic component. The outline of the second electronic component 32 viewed in the thickness direction D1 of the resin structure 2 is rectangular or substantially rectangular, for example. This is not limiting. For example, the outline of the second electronic component 32 may be square or substantially square.

The third electronic component 33 is, for example, a chip electronic component. The length of the third electronic component 33 in the lengthwise direction D2 of the resin structure 2 is greater than that of the second electronic component 32. The outline of the third electronic component 33 viewed in the thickness direction D1 of the resin structure 2 is rectangular or substantially rectangular, for example. This is not limiting. For example, the outline of the third electronic component 33 may be square or substantially square. In the electronic component module 1 according to the present preferred embodiment, the height H1 of the first electronic component 31 is greater than the height H2 of the third electronic component 33.

The fourth electronic component 34 is, for example, a chip electronic component. The outline of the fourth electronic component 34 viewed in the thickness direction D1 of the resin structure 2 is square or substantially square, for example. This is not limiting. For example, the outline of the fourth electronic component 34 may be rectangular. In the electronic component module 1 according to the present preferred embodiment, the second electronic component 32 and the fourth electronic component 34 are built in the resin structure 2.

The term, "built in", herein encompasses a first state and a second state. The first state refers to a state in which a principal surface of the second electronic component 32 and that of the fourth electronic component 34 are not covered by the resin structure 2 (that is, a principal surface of the second electronic component 32 and that of the fourth electronic component 34 are exposed on the resin structure 2). The second state refers to a state in which the portions (including the principal surfaces), except connection portions to external circuits, of the second electronic component 32 and the fourth electronic component 34 are covered by the resin structure 2.

Each of the first electronic component 31, the second electronic component 32, the third electronic component 33, and the fourth electronic component 34 is, for example, a semiconductor device (semiconductor chip). Examples of the semiconductor device include an IC (Integrated Circuit), an MPU (Micro Processing Unit), a power amplifier, a low noise amplifier, and an RF (Radio Frequency) switch. Each of the first electronic component 31, the second electronic component 32, the third electronic component 33, and the fourth electronic component 34 is not limited to a semiconductor device, and may be, for example, an inductor, a capacitor, or a resistor.

The first electronic component 31 is electrically connected to the conductive portions 311. Each of the conductive portions 311 has an L shape by using a first conductive portion, which is disposed along the corresponding side surface of the first electronic component 31, and a second conductive portion, which is disposed along the bottom surface of the first electronic component 31. The first electronic component 31 is electrically connected to the corresponding ones of the first wiring layers 41 by connecting the second conductive portions of the conductive portions 311 to the conductive body portions 11 disposed along the bottom surface 232 of the recess 23 of the resin structure 2.

(2.3) The Wiring Layers

The electronic component module 1 according to the present preferred embodiment further includes the second wiring layers 42 in addition to the first wiring layers 41 defining and functioning as the wiring layer 4.

The first wiring layers 41 are electrically connected to the respective first to fourth electronic components 31 to 34 and the respective columnar electrodes 5, on the first principal surface 21 side of the resin structure 2. Among the first wiring layers 41, those corresponding to the second to fourth electronic components 32 to 34 are provided along the first principal surface 21 of the resin structure 2. Among the first wiring layers 41, those corresponding to the first electronic component 31 are provided on the first principal surface 21 of the resin structure and on the recess 23. Specifically, among the first wiring layers 41, those corresponding to the first electronic component 31 are provided on the first principal surface 21 of the resin structure 2, on the side surfaces 231 of the recess 23 which connect with the first principal surface 21, and on the bottom surface 232 of the recess 23. In other words, among the first wiring layers 41, those corresponding to the first electronic component 31 are provided by a single layer which is integrally provided along the first principal surface 21 of the resin structure 2, the side surfaces 231 of the recess 23, and the bottom surface 232 of the recess 23.

On the second principal surface 22 side of the resin structure 2, each of the second wiring layers 42 electrically connects the corresponding one of the columnar electrodes 5 to the corresponding one of the second terminal electrodes 8. Each of the second wiring layers 42 is provided along the second principal surface 22 of the resin structure 2.

The material of the first wiring layers 41 and the second wiring layers 42 is, for example, an alloy, or a single metal layer or a multilayer metal body. In the electronic component module 1 according to the present preferred embodiment, the material of the first wiring layer 41 and the second wiring layer 42 is, for example, a material, in which at least one member selected from the group consisting of chromium, nickel, iron, cobalt, and zinc is added to copper, or a multilayer body of copper and titanium.

(2.4) The Columnar Electrodes

In the electronic component module 1 according to the present preferred embodiment, as illustrated in FIG. 1, the resin structure 2 holds the columnar electrodes 5. The columnar electrodes 5 are disposed on the sides of the first electronic component 31, the second electronic component 32, and the fourth electronic component 34. The columnar electrodes 5 are separated from the outer surfaces of the first electronic component 31, the second electronic component 32, and the fourth electronic component 34. The columnar electrodes 5 are separated from each other. The number of columnar electrodes 5 and the positions of the columnar electrodes 5 are not limited to those in the example in FIG. 1.

Each of the columnar electrodes 5 is, for example, columnar and extends in the direction parallel or substantially parallel to the thickness direction D1 of the resin structure 2. Each of the columnar electrodes 5 includes a first end surface and a second end surface which are opposite to each other in the direction parallel or substantially parallel to the thickness direction D1 of the resin structure 2. The first end surface (the top end surface in FIG. 1) of each of the columnar electrodes 5 is electrically connected to the corresponding one of the first wiring layers 41 through a corresponding conductive portion 12. The conductive portion 12 has, for example, a layered structure in which gold, nickel, and copper are laminated in this sequence from the first principal surface 21 side of the resin structure 2. The second end surface (the bottom end surface in FIG. 1) of each of the columnar electrodes 5 is electrically connected to the corresponding one of the second wiring layers 42.

The material of the columnar electrodes 5 is, for example, a metal. In the electronic component module 1 according to the present preferred embodiment, the material of the columnar electrodes 5 is, for example, copper.

(2.5) The Insulating Layers

The electronic component module 1 according to the present preferred embodiment further includes a first insulating layer 61 and a second insulating layer 62, which define and function as the insulating layer 6, as well as portions of a third insulating layer 63 and portions of a fourth insulating layer 64. Each of the first insulating layer 61, the second insulating layer 62, the third insulating layer 63, and the fourth insulating layer 64 is an electrically insulating layer. The first insulating layer 61 is positioned on the upper side of the first wiring layers 41. The second insulating layer 62 is positioned on the lower side of the first wiring layers 41.

The first insulating layer 61 prevents solder from spreading out from the first terminal electrodes 7. The third insulating layer 63 prevents solder from spreading out from the second terminal electrodes 8. The second insulating layer 62 improves close contact between the first wiring layers 41 and the resin structure 2. The fourth insulating layer 64 improves close contact between the second wiring layers 42 and the resin structure 2.

The first insulating layer 61 is patterned along the first principal surface 21 of the resin structure 2. A site, corresponding to the recess 23, of the first insulating layer 61 is provided on the first principal surface 21 of the resin structure 2, on the side surfaces 231 of the recess 23 which connect with the first principal surface 21, and on the bottom surface 232 of the recess 23. In other words, the site, corresponding to the recess 23, of the first insulating layer 61 is a single layer which is integrally provided along the first principal surface 21 of the resin structure 2, the side surfaces 231 of the recess 23, and the bottom surface 232 of the recess 23.

The second insulating layer 62 is patterned along the first principal surface 21 of the resin structure 2. A site, corresponding to the recess 23, of the second insulating layer 62 is provided on the first principal surface 21 of the resin structure 2, on the side surfaces 231 of the recess 23 which connect with the first principal surface 21, and on the bottom surface 232 of the recess 23. In other words, the site, corresponding to the recess 23, of the second insulating layer 62 is a single layer which is integrally provided along the first principal surface 21 of the resin structure 2, the side surfaces 231 of the recess 23, and the bottom surface 232 of the recess 23.

Each of the third insulating layer 63 and the fourth insulating layer 64 are patterned along the second principal surface 22 of the resin structure 2.

The material of the first insulating layer 61 and that of the third insulating layer 63 have wettability lower than those of the first terminal electrode 7 and the second terminal electrode 8. The material of the first insulating layer 61 and that of the third insulating layer 63 are organic materials such as, for example, polyimide. However, this is not limiting. The material of the first insulating layer 61 and that of the third insulating layer 63 are not limited to organic materials such as polyimide, and may be inorganic materials, for example.

The material of the second insulating layer 62 and that of the fourth insulating layer 64, which define and function as close contact layers, are, for example, resins (such as epoxy resin, polyimide resin, polybenzoxazole, benzocyclobutene, bismaleimide, ring olefin resin, and phenolic resin).

(2.6) The First Terminal Electrodes

The first terminal electrodes 7 are positioned so as to be separated from the first principal surface 21 on the first principal surface 21 side of the resin structure 2. Each of the first terminal electrodes 7 is electrically connected to the corresponding one of the columnar electrodes 5 through the corresponding first wiring layer 41 and the corresponding conductive part 12. Each of the first terminal electrodes 7 has, for example, a layered structure of a nickel layer and a metal on the nickel layer. Each of the first terminal electrodes 7 is not limited to the case having a layered structure, and may have a single layer structure.

(2.7) The Second Terminal Electrodes

The second terminal electrodes 8 are positioned so as to be separated from the second principal surface 22 on the second principal surface 22 side of the resin structure 2. Each of the second terminal electrodes 8 is electrically connected to the corresponding one of the columnar electrodes 5 through the corresponding second wiring layer 42. Each of the second terminal electrodes 8 has, for example, a layered structure of a nickel layer and a metal layer on the nickel layer. Each of the second terminal electrodes 8 is not limited to the case of having a layered structure, and may be a single layer structure.

(2.8) A Protective Layer

In the electronic component module 1 according to the present preferred embodiment, as illustrated in FIG. 1, the first electronic component 31 and the third electronic component 33 are covered by a protective layer 10. The material of the protective layer 10 is, for example, synthetic resin, such as epoxy resin or polyimide resin. The size of the protective layer 10 viewed in the thickness direction D1 of the resin structure 2 is the same or substantially the same as that of the resin structure 2.

(3) A Method of Manufacturing the Electronic Component Module

A method of manufacturing the electronic component module 1 according to the present preferred embodiment will be described by referring to FIGS. 2A to 2C, 3A to 3C, and 4A to 4D. In the method of manufacturing the electronic component module 1 according to the present preferred embodiment, after the first to fourth electronic components 31 to 34 are prepared, the first to thirteenth processes are sequentially performed.

Figure 2A:
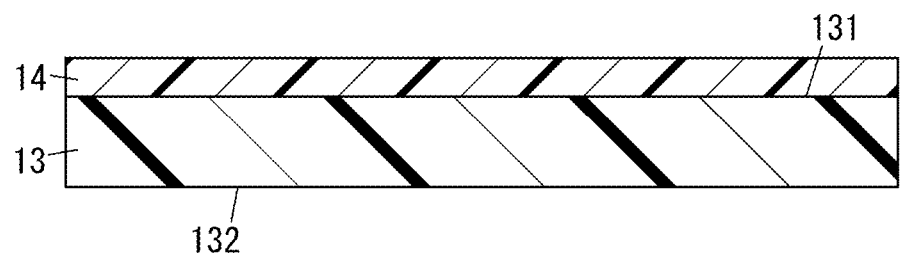
FIGS. 2A to 2C are sectional views for describing a method of manufacturing the electronic component module.

In the first process, as illustrated in FIG. 2A, a temporary fixing member 14 is formed on a first principal surface 131 of a first support (support) 13 including the first principal surface 131 and a second principal surface 132. The first support is formed, for example, of a glass epoxy material. The temporary fixing member 14 is formed directly on the first principal surface 131 of the first support 13. The first support 13 is not limited to a glass epoxy material, and may be formed, for example, of a metal material, such as stainless steel or aluminum, an inorganic material, such as alumina or various types of glass, and a resin material, such as PET film, PEN film, or polyimide film.

Figure 2B:
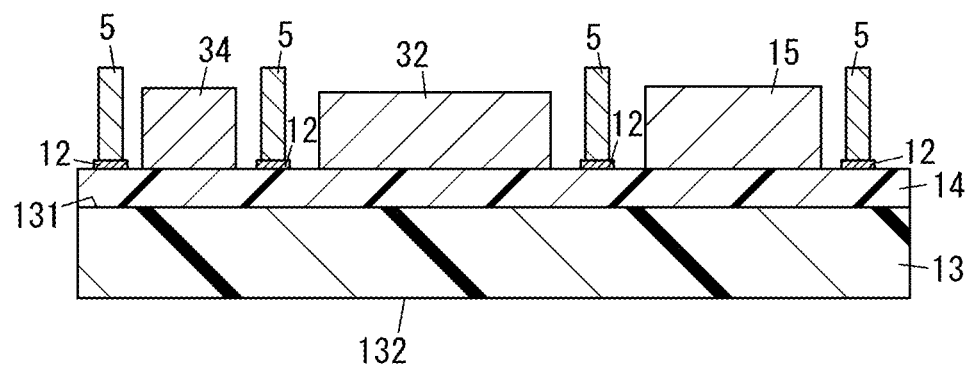

In the second process, as illustrated in FIG. 2B, the columnar electrodes 5 are formed on the first principal surface 131 of the first support 13. The expression, "the columnar electrodes 5 are formed on the first principal surface 131 of the first support 13", encompasses the case in which the columnar electrodes 5 are formed directly on the first principal surface 131 of the first support 13, and the case in which the columnar electrodes 5 are formed indirectly on the first principal surface 131 of the first support 13. In the second process, the columnar electrodes 5 are formed on the first principal surface 131 of the first support 13 with the temporary fixing member 14 interposed therebetween. That is, in the second process, the columnar electrodes 5 are formed indirectly on the first principal surface 131 of the first support 13. In addition, in the second process, the columnar electrodes 5 are formed on the first principal surface 131 of the first support 13 with the temporary fixing member 14 and the conductive portions 12 which are interposed therebetween.

In the second process, as illustrated in FIG. 2B, the second electronic component 32 and the fourth electronic component 34 are disposed on the first principal surface 131 of the first support 13. The expression, "the second electronic component 32 and the fourth electronic component 34 are disposed on the first principal surface 131 of the first support 13", encompasses the case in which the second electronic component 32 and the fourth electronic component 34 are disposed directly on the first principal surface 131 of the first support 13, and the case in which the second electronic component 32 and the fourth electronic component 34 are disposed indirectly on the first principal surface 131 of the first support 13. In the second process, the second electronic component 32 and the fourth electronic component 34 are disposed on the first principal surface 131 of the first support 13 with the temporary fixing member 14 interposed therebetween. That is, the second electronic component 32 and the fourth electronic component 34 are disposed indirectly on the first principal surface 131 of the first support 13. The size of the second electronic component 32 viewed in the thickness direction of the first support 13 is smaller than that of the first principal surface 131 of the first support 13.

In the second process, as illustrated in FIG. 2B, a sacrificial body 15 is disposed on the first principal surface 131 of the first support 13. The expression, "a sacrificial body 15 is disposed on the first principal surface 131 of the first support 13", encompasses the case in which the sacrificial body 15 is disposed directly on the first principal surface 131 of the first support 13, and the case in which the sacrificial body 15 is disposed indirectly on the first principal surface 131 of the first support 13. In the second process, the sacrificial body 15 is disposed on the first principal surface 131 of the first support 13 with the temporary fixing member 14 interposed therebetween. That is, in the second process, the sacrificial body 15 is disposed indirectly on the first principal surface 131 of the first support 13. The sacrificial body 15 is a member for forming the recess 23 in the resin structure 2. As described below, the sacrificial body 15 is removed from the resin structure 2, and the recess 23 is thus formed in the resin structure 2.

The sacrificial body 15, the second electronic component 32, and the fourth electronic component 34 are disposed side by side along the principal surface of the temporary fixing member 14. The columnar electrodes 5 are disposed on the sides of the sacrificial body 15, the second electronic component 32, and the fourth electronic component 34.

The sacrificial body 15 has, for example, a chip shape. The outline of the sacrificial body 15 viewed in the thickness direction of the first support 13 has a rectangular or substantially rectangular shape. This is not limiting. The outline of the sacrificial body 15 may be, for example, square or substantially square. The size of the sacrificial body 15 viewed in the thickness direction of the first support 13 is smaller than that of the first principal surface 131 of the first support 13. The material of the sacrificial body 15 is, for example, a metal, such as copper or aluminum, a resist material, such as silicon (Si), novolac resin, or acryl resin, or paraffin wax. In the method of manufacturing the electronic component module 1 according to the present preferred embodiment, the sacrificial body 15 is formed, for example, of copper. That is, in the method of manufacturing the electronic component module 1 according to the present preferred embodiment, the material of the sacrificial body 15 is different from that of the resin structure 2. When the material of the sacrificial body 15 is formed of copper, the sacrificial body 15 may be patterned, for example, through photolithography technology. Thus, the sacrificial body 15 having highly accurate dimensions may be formed.

In the method of manufacturing the electronic component module 1 according to the present preferred embodiment, the second process includes the sacrificial-body arrangement step, in which the sacrificial body 15 is disposed on the first principal surface 131 of the first support 13, the second-component arrangement step, in which the second electronic component 32 is disposed on the first principal surface 131 of the first support 13, and the electrode forming step, in which the columnar electrodes 5 are disposed on the first principal surface 131 of the first support 13.

Figure 2C:
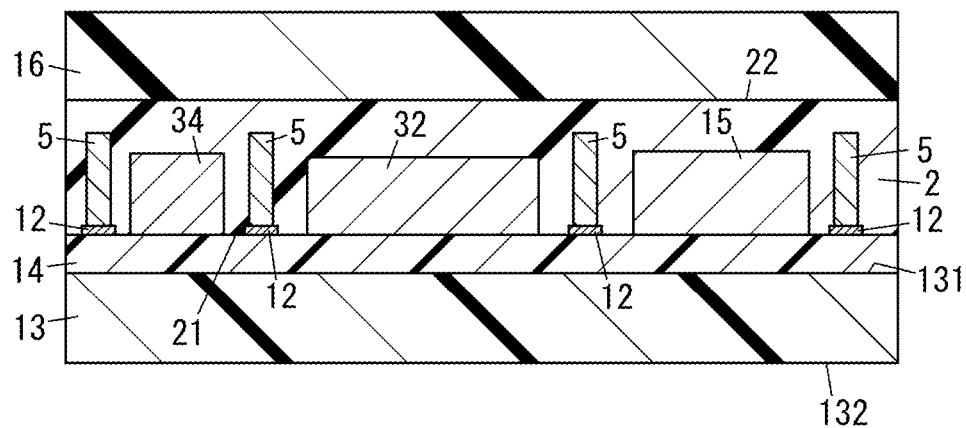

In the third process, as illustrated in FIG. 2C, the resin structure 2 is formed on the first principal surface 131 of the first support 13 so as to cover the columnar electrodes 5, the sacrificial body 15, the second electronic component 32, and the fourth electronic component 34. The expression, "the resin structure 2 is formed on the first principal surface 131 of the first support 13", encompasses the case in which the resin structure 2 is formed directly on the first principal surface 131 of the first support 13, and the case in which the resin structure 2 is formed indirectly on the first principal surface 131 of the first support 13. In the third process, the resin structure 2 is formed on the first principal surface 131 of the first support 13 with the temporary fixing member 14 interposed therebetween. That is, in the third process, the resin structure 2 is formed indirectly on the first principal surface 131 of the first support 13.

In the third process, as illustrated in FIG. 2C, a second support 16 is formed on the second principal surface 22 of the resin structure 2. The expression, "a second support 16 is formed on the second principal surface 22 of the resin structure 2", encompasses the case in which the second support 16 is formed directly on the second principal surface 22 of the resin structure 2, and the case in which the second support 16 is formed indirectly on the second principal surface 22 of the resin structure 2. In the third process, the second support 16 is formed directly on the second principal surface 22 of the resin structure 2.

In the method of manufacturing the electronic component module 1 according to the present preferred embodiment, the third process includes the resin molding step in which the resin structure 2 is molded on the first principal surface 131.

Figure 3A:
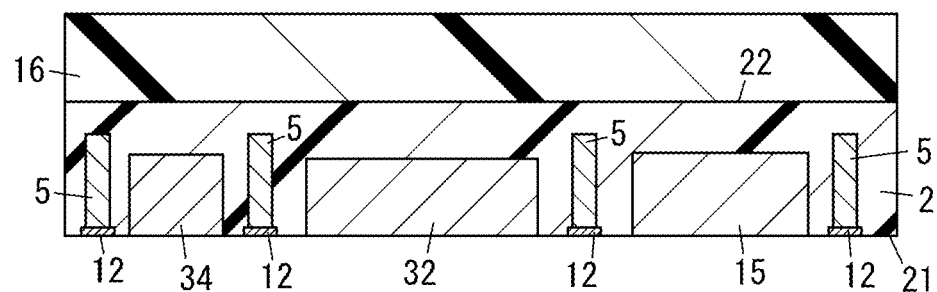
FIGS. 3A to 3C are sectional views for describing the method of manufacturing the electronic component module.

In the fourth process, the first support 13 and the temporary fixing member 14 are removed from the structure formed in the third process (see FIG. 2C). Thus, the structure illustrated in FIG. 3A is obtained. In the fourth process, the first principal surface 21 of the resin structure 2 is thus exposed. In the fourth process, for example, adhesion of the temporary fixing member 14 is reduced, and the first support 13 is removed (stripped).

Figure 3B:
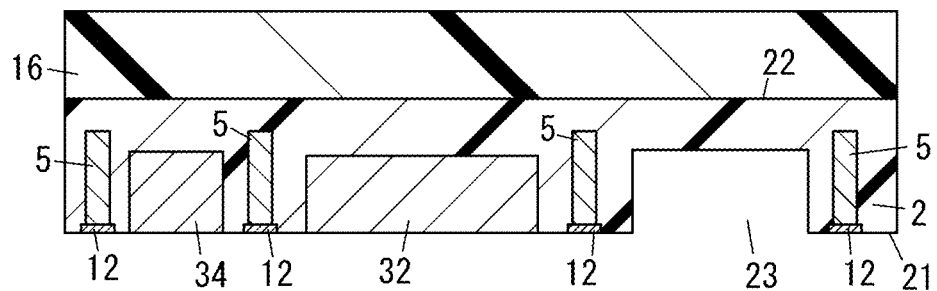

In the fifth process, as illustrated in FIG. 3B, the sacrificial body 15 is removed, and the recess 23 is thus formed in the resin structure 2. In the fifth process, for example, wet etching is used to remove the sacrificial body 15. In the method of manufacturing the electronic component module 1 according to the present preferred embodiment, for example, the material of the sacrificial body 15 is copper. Therefore, as an etching solution (etchant) used to perform wet etching on the sacrificial body 15, for example, ammonium persulfate, ferric chloride, or nitric acid may be used. The etching solution used to remove the sacrificial body 15 in the fifth process is preferably an etching solution having a large etching selectivity (the etching rate of the sacrificial body 15/the etching rate of the resin structure 2) in view of selective etching of the sacrificial body 15 on the resin structure 2, and is more preferable that an etching solution with which etching is not performed on the resin structure 2 is used. In the method of manufacturing the electronic component module 1 according to the present preferred embodiment, the first end surfaces of the columnar electrodes 5 are covered by the conductive portions 12. Therefore, corrosion of the columnar electrodes 5 caused by the etching solution for removing the sacrificial body 15 may be reduced or prevented.

When the material of the sacrificial body 15 is aluminum, for example, the sacrificial body 15 is preferably removed by using an etching solution, such as hydrochloric acid solution or mixed acid solution (a mixed solution of phosphate and acetic acid). When the material of the sacrificial body 15 is silicon, for example, the sacrificial body 15 is preferably removed by using a hydrofluoric acid etching solution. When the material of the sacrificial body 15 is a resist material, for example, the sacrificial body 15 is preferably stripped by using an N-methylpyrrolidone stripping solution. When the material of the sacrificial body 15 is paraffin wax, the sacrificial body 15 is preferably removed by vaporizing the sacrificial body 15 through heating. For example, the material of the sacrificial body 15 may be carbon, and the recess 23 may be formed by removing the carbon.

In the method of manufacturing the electronic component module 1 according to the present preferred embodiment, the fifth process includes the recess forming step in which the recess 23 is formed in the resin structure 2 by removing the sacrificial body 15.

Figure 3C:
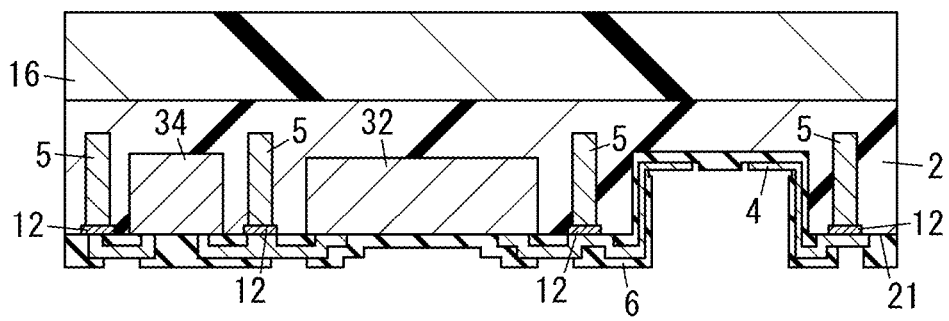

In the sixth process, as illustrated in FIG. 3C, the wiring layer 4 and the insulating layer 6 are formed. In the sixth process, the second insulating layer 62 (see FIG. 1), which defines and functions as a close contact layer, of the insulating layer 6 is formed. The second insulating layer 62 is a ground layer of the wiring layer 4 (the first wiring layers 41). In the sixth process, for example, a photosensitive resist is applied to the resin structure 2. Then, through exposure and development, the second insulating layer 62 is formed.

In the sixth process, after the second insulating layer 62 is formed, the wiring layer 4 is formed. In the sixth process, for example, a power feed film is formed on the resin structure 2. Then, after photosensitive resist is applied on the resin structure 2, exposure and development are performed to obtain a resist pattern. In the sixth process, after a plating layer is formed through electroplating, for example, unnecessary portions of the power feed film are removed, and the wiring layer 4 is formed.

In the sixth process, after the wiring layer 4 is formed, the first insulating layer 61 is formed. The method of forming the first insulating layer 61 is the same or substantially the same as that for the second insulating layer 62, and will not be described.

In the method of manufacturing the electronic component module 1 according to the present preferred embodiment, the sixth process includes the wiring-layer forming step, in which the wiring layer 4 is formed, and the insulating-layer forming step, in which the insulating layer 6 is formed.

Figure 4A:
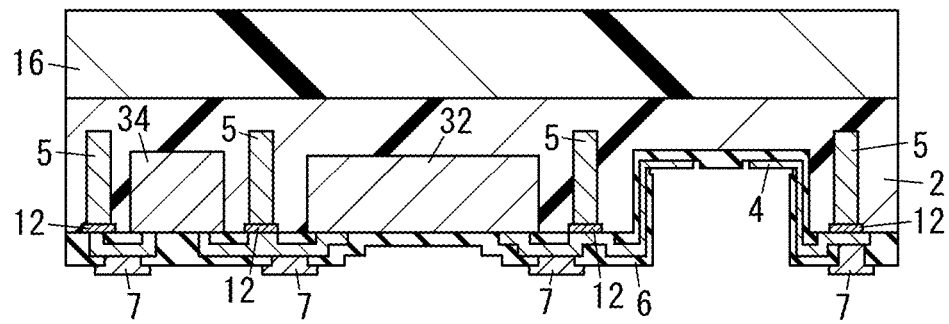
FIGS. 4A to 4D are sectional views for describing the method of manufacturing the electronic component module.

In the seventh process, as illustrated in FIG. 4A, the first terminal electrodes 7 are formed. In the seventh process, for example, sputtering, photolithography technology, etching technology, and plating technology may be used to form the first terminal electrodes 7.

Figure 4B:
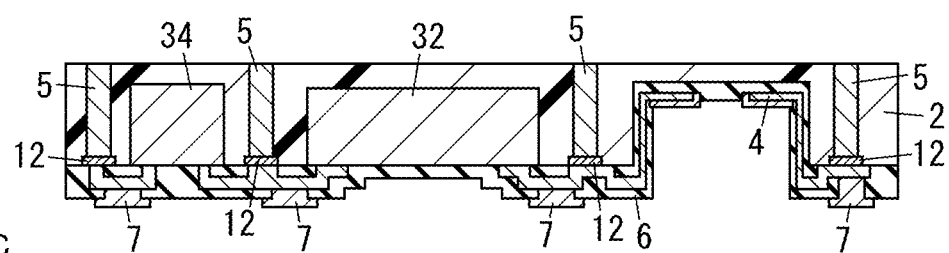

In the eighth process, the second support 16 is removed from the structure formed in the seventh process (see FIG. 4A). Thus, the structure illustrated in FIG. 4B is obtained. In the eighth process, the second principal surface 22 of the resin structure 2 is further ground to expose the second end surfaces (the top end surfaces in FIG. 4B) of the columnar electrodes 5.

Figure 4C:
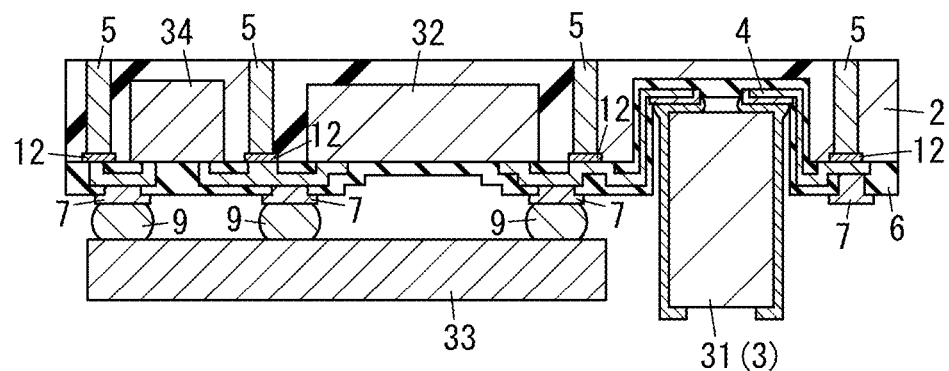

In the ninth process, as illustrated in FIG. 4C, the first electronic component 31 defining and functioning as the electronic component 3 is disposed in the recess 23 of the resin structure 2. The first electronic component 31 is electrically connected to the corresponding first wiring layers 41. In the ninth process, the second conductive portions of the conductive portions 311, which are electrically connected to the first electronic component 31, are connected to the respective conductive body portions 11 disposed on the bottom surface 232 of the recess 23. Thus, the first electronic component 31 is mechanically held in the resin structure 2, and is electrically connected to the corresponding first wiring layers 41.

In the ninth process, as illustrated in FIG. 4C, the third electronic component 33 is disposed on the first principal surface 21 of the resin structure 2. In the ninth process, the third electronic component 33 is connected to the first terminal electrodes 7 with, for example, solder bumps 9 interposed therebetween. Thus, the third electronic component 33 is held by the resin structure 2 mechanically, and is electrically connected to the corresponding first wiring layers 41.

In the method of manufacturing the electronic component module 1 according to the present preferred embodiment, the ninth process includes the component mounting step, in which the electronic component 3 is mounted in the recess 23 of the resin structure 2, and the third-component arrangement step, in which the third electronic component 33 is disposed on the first principal surface 21 of the resin structure 2.

In the method of manufacturing the electronic component module 1 according to the present preferred embodiment, the process in which the electronic component 3 is disposed in the recess 23 of the resin structure 2, and the process in which the electronic component 3 is electrically connected to the wiring layer 4 are performed at the same time in a single process (the component mounting step), but may be performed in two respective processes.

Figure 4D:
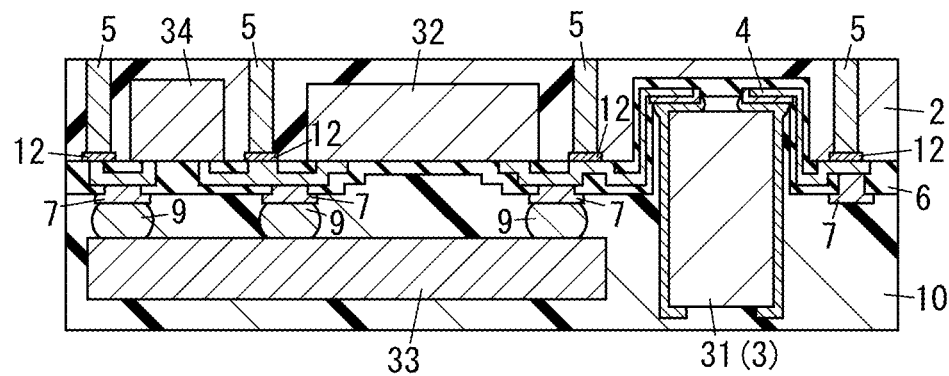

In the tenth process, as illustrated in FIG. 4D, the protective layer 10 is formed so as to cover the first electronic component 31 and the third electronic component 33 which are mounted on the resin structure 2.

In the eleventh process, the fourth insulating layer 64, the second wiring layers 42, and the third insulating layer 63 are formed in this sequence on the second principal surface 22 of the resin structure 2.

In the twelfth process, the second terminal electrodes 8 are formed. In the twelfth process, for example, sputtering, photolithography technology, etching technology, and plating technology may be used to form the second terminal electrodes 8.

In the thirteenth process, for example, a wafer, in which electronic component modules 1 are formed, is cut through dicing, and the individual electronic component modules 1 are cut out.

(4) Effects

The method of manufacturing the electronic component module 1 according to the present preferred embodiment includes the recess forming step. In the recess forming step, the recess 23 is formed in the resin structure 2 by removing the sacrificial body 15. That is, in the recess forming step, the recess 23 for mounting the electronic component 3 is formed by removing the sacrificial body 15 from the resin structure 2. Therefore, all of the recess 23 is formed by using the resin structure 2 which is an integral resin molded body. This provides an advantage that, for example, in formation of the protective layer 10 on the resin structure 2, even when a stress is applied to the electronic component 3 mounted in the recess 23 of the resin structure 2, the resin structure 2 is difficult to break.

The method of manufacturing the electronic component module 1 according to the present preferred embodiment includes the wiring-layer forming step. In the wiring-layer forming step, the wiring layer 4 is formed on the first principal surface (principal surface) 21 of the resin structure 2 and on the side surfaces 231 of the recess 23 connecting with the first principal surface 21. That is, the wiring layer 4 is integrally formed from the first principal surface 21 of the resin structure 2 to the side surfaces 231 of the recess 23. This provides an advantage that, for example, in formation of the protective layer 10 on the resin structure 2, even when a stress is applied to the electronic component 3 mounted in the recess 23 of the resin structure 2, the wiring layer 4 is difficult to break.

When a recess (opening portion) is formed by laminating an intermediate layer and a surface layer as described in Japanese Unexamined Patent Application Publication No. 2010-141282, a misalignment in the multilayer structure between the intermediate layer and the surface layer may increase the module size. In contrast, when the resin structure 2 is formed of a single resin molded body as in the method of manufacturing the electronic component module 1 according to the present preferred embodiment, an increase of the module size caused by a misalignment in a multilayer structure may be reduced or prevented.

In the method of manufacturing the electronic component module 1 according to the present preferred embodiment, the recess 23 is formed in the resin structure 2 by removing the sacrificial body 15. This provides an advantage that a member for forming a recess is unnecessary.

In the method of manufacturing the electronic component module 1 according to the present preferred embodiment, in the recess forming step, the sacrificial body 15 is removed through etching. This facilitates formation of the recess 23.

The method of manufacturing the electronic component module 1 according to the present preferred embodiment further includes the second-component arrangement step. In the second-component arrangement step, the second electronic component 32 is disposed on the first principal surface 21 of the resin structure 2 so as not to overlap the sacrificial body 15 in the thickness direction of the first support 13, thus achieving a highly-integrated electronic component module 1.

The method of manufacturing the electronic component module 1 according to the present preferred embodiment further includes the third-component arrangement step. In the third-component arrangement step, the third electronic component 33 is disposed on the first principal surface 21 of the resin structure 2 so as not to overlap the first electronic component 31 in the thickness direction D1 of the resin structure 2, thus achieving a highly-integrated electronic component module 1.

The method of manufacturing the electronic component module 1 according to the present preferred embodiment further includes the insulating-layer forming step. In the insulating-layer forming step, the insulating layer 6 is formed at least on the first principal surface (principal surface) 21 of the resin structure 2 and the side surfaces 231 of the recess 23. That is, the insulating layer 6 is integrally formed at least from the first principal surface 21 of the resin structure 2 to the side surfaces 231 of the recess 23. This provides an advantage that, for example, in formation of the protective layer 10 on the resin structure 2, even when a stress is applied to the electronic component 3 mounted in the recess 23 of the resin structure 2, the insulating layer 6 is difficult to break.

In the method of manufacturing the electronic component module 1 according to the present preferred embodiment, in the insulating-layer forming step, the insulating layer 6 is formed on the first principal surface (principal surface) 21 of the resin structure 2, on the side surfaces 231 of the recess 23 which connect with the first principal surface 21, and on the bottom surface 232 of the recess 23. This provides an advantage that the insulating layer 6 is even more difficult to break.

The method of manufacturing the electronic component module 1 according to the present preferred embodiment further includes the electrode forming step. In the electrode forming step, the columnar electrodes 5 are formed on the first principal surface 131 of the first support 13. Therefore, the columnar electrodes 5 enable electrodes to extend to the second principal surface 22 side which is opposite the first principal surface 21 on which the electronic component 3 is disposed. Compared with the case in which electrodes extend to the first principal surface 21 side, a reduction of the size of the electronic component module 1 may be achieved. In addition, the columnar electrodes 5 may provide a layered structure of electronic components, thus achieving a highly-integrated electronic component module 1.

In the method of manufacturing the electronic component module 1 according to the present preferred embodiment, in the wiring-layer forming step, the wiring layer 4 is formed on the first principal surface (principal surface) 21 of the resin structure 2, on the side surfaces 231 of the recess 23 which connect with the first principal surface 21, and on the bottom surface 232 of the recess 23. This provides an advantage that the wiring layer 4 is even more difficult to break.

In the method of manufacturing the electronic component module 1 according to the present preferred embodiment, the material of the sacrificial body 15 is different from that of the resin structure 2. This provides an advantage that, for example, when the sacrificial body 15 is removed through etching, the resin structure 2 hardly receives an influence from the etching.

The electronic component module 1 according to the present preferred embodiment includes the resin structure 2 which includes the recess 23 for disposing the electronic component 3. This provides an advantage that, even when a stress is applied to the electronic component 3, which is disposed in the recess 23 of the resin structure 2, for example, in the thickness direction D1 of the resin structure 2, the resin structure 2 is difficult to break.

The electronic component module 1 according to the present preferred embodiment includes the wiring layer 4. The wiring layer 4 is provided on the first principal surface 21 of the resin structure 2 and on the side surfaces 231 of the recess 23 which connect with the first principal surface 21. That is, the wiring layer 4 is integrally provided from the first principal surface 21 to the side surfaces 231 of the recess 23. This also provides an advantage that, even when a stress is applied to the electronic component 3, which is disposed in the recess 23 of the resin structure 2, for example, in the thickness direction D1 of the resin structure 2, the wiring layer 4 is difficult to break.

When a recess (opening portion) is formed by laminating an intermediate layer and a surface layer as described in Japanese Unexamined Patent Application Publication No. 2010-141282, a misalignment in the multilayer structure between the intermediate layer and the surface layer may increase the module size. In contrast, when the resin structure 2 includes the recess 23 as in the electronic component module 1 according to the present preferred embodiment, an increase of the module size caused by a misalignment in a multilayer structure may be reduced or prevented.

The electronic component module 1 according to the present preferred embodiment further includes the columnar electrodes 5. The columnar electrodes 5 extend through the resin structure 2 in the thickness direction D1 of the resin structure 2. This enables electrodes to extend to the second principal surface 22 side which is opposite the first principal surface 21 on which the electronic component 3 is disposed. Compared with the case in which electrodes extend to the first principal surface 21 side, the electronic component module 1 may be reduced in size. The columnar electrodes 5 may provide a layered structure of electronic components, thus achieving a highly-integrated electronic component module 1.

In the electronic component module 1 according to the present preferred embodiment, the wiring layer 4 is provided on the first principal surface 21 of the resin structure 2, on the side surfaces 231 of the recess 23 which connect with the first principal surface 21, and on the bottom surface 232 of the recess 23. This provides an advantage that the wiring layer 4 is even more difficult to break.

The electronic component module 1 according to the present preferred embodiment further includes the insulating layer 6. The insulating layer 6 is provided at least on the first principal surface (principal surface) 21 of the resin structure 2 and the side surfaces 231 of the recess 23. That is, the insulating layer 6 is integrally provided at least from the first principal surface 21 of the resin structure 2 to the side surfaces 231 of the recess 23. This provides an advantage that, even when a stress is applied to the electronic component 3 mounted in the recess 23 of the resin structure 2, the insulating layer 6 is difficult to break.

In the electronic component module 1 according to the present preferred embodiment, the insulating layer 6 is provided on the first principal surface (principal surface) 21 of the resin structure 2, on the side surfaces 231 of the recess 23 which connect with the first principal surface 21, and on the bottom surface 232 of the recess 23. This provides an advantage that the insulating layer 6 is even more difficult to break. Specifically, this provides an advantage that, when a stress is applied to the electronic component 3, which is mounted in the recess 23 of the resin structure 2, for example, in the thickness direction D1 of the resin structure 2, the insulating layer 6 is difficult to break.

The electronic component module 1 according to the present preferred embodiment further includes the second electronic component 32. The second electronic component 32 is built in the resin structure 2 at a position at which the second electronic component 32 does not overlap the first electronic component 31 in the thickness direction D1 of the resin structure 2. This achieves a highly-integrated electronic component module 1.

The electronic component module 1 according to the present preferred embodiment further includes the third electronic component 33. The third electronic component 33 is disposed on the first principal surface 21 of the resin structure 2 so as not to overlap the first electronic component 31 in the thickness direction D1 of the resin structure 2. This achieves a highly-integrated electronic component module 1.

In the electronic component module 1 according to the present preferred embodiment, the height H1 of the first electronic component 31 is greater than the height H2 of the third electronic component 33 in the thickness direction D1 of the resin structure 2. Therefore, the first electronic component 31, which is relatively higher than the third electronic component 33, is disposed in the recess 23, thus achieving a reduction in profile of the electronic component module 1.

(5) Modified Examples

Modified examples of the electronic component module 1 according to the present preferred embodiment will be described below.

(5.1) First Modified Example

Figure 5:
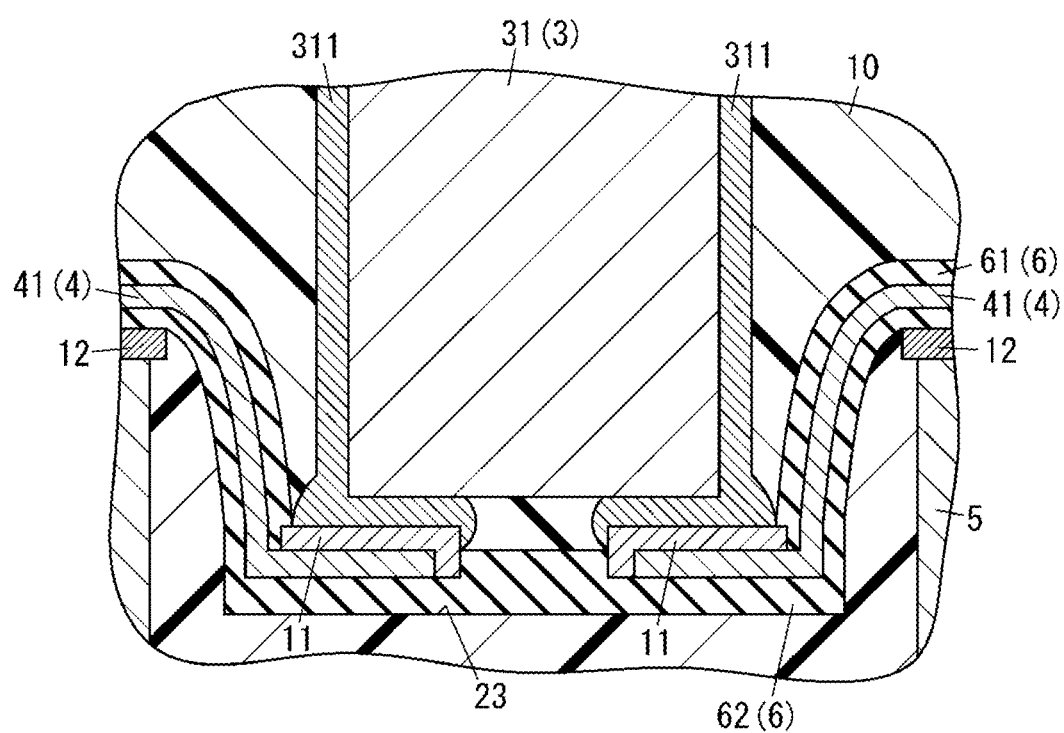
FIG. 5 is a sectional view of a portion of an electronic component module according to a first modified example of a preferred embodiment of the present invention.

As illustrated in FIG. 5, the shape of the recess 23 viewed in the direction intersecting the thickness direction D1 of the resin structure 2 (the direction perpendicular or substantially perpendicular to the plane of FIG. 5) may be an upwardly-flared tapered-out shape in which the opening becomes larger toward the upper side. In this case, the first wiring layers 41, the first insulating layer 61, and the second insulating layer 62, which are provided in the recess 23, curve along the shape of the recess 23.

As described above, the tapered-out recess 23 provides an advantage that the first electronic component 31 is easily housed in the recess 23. In addition, the first wiring layers 41, which curve along the recess 23, provide an advantage that the first wiring layers 41 are difficult to break.

(5.2) Second Modified Example

Figure 6:
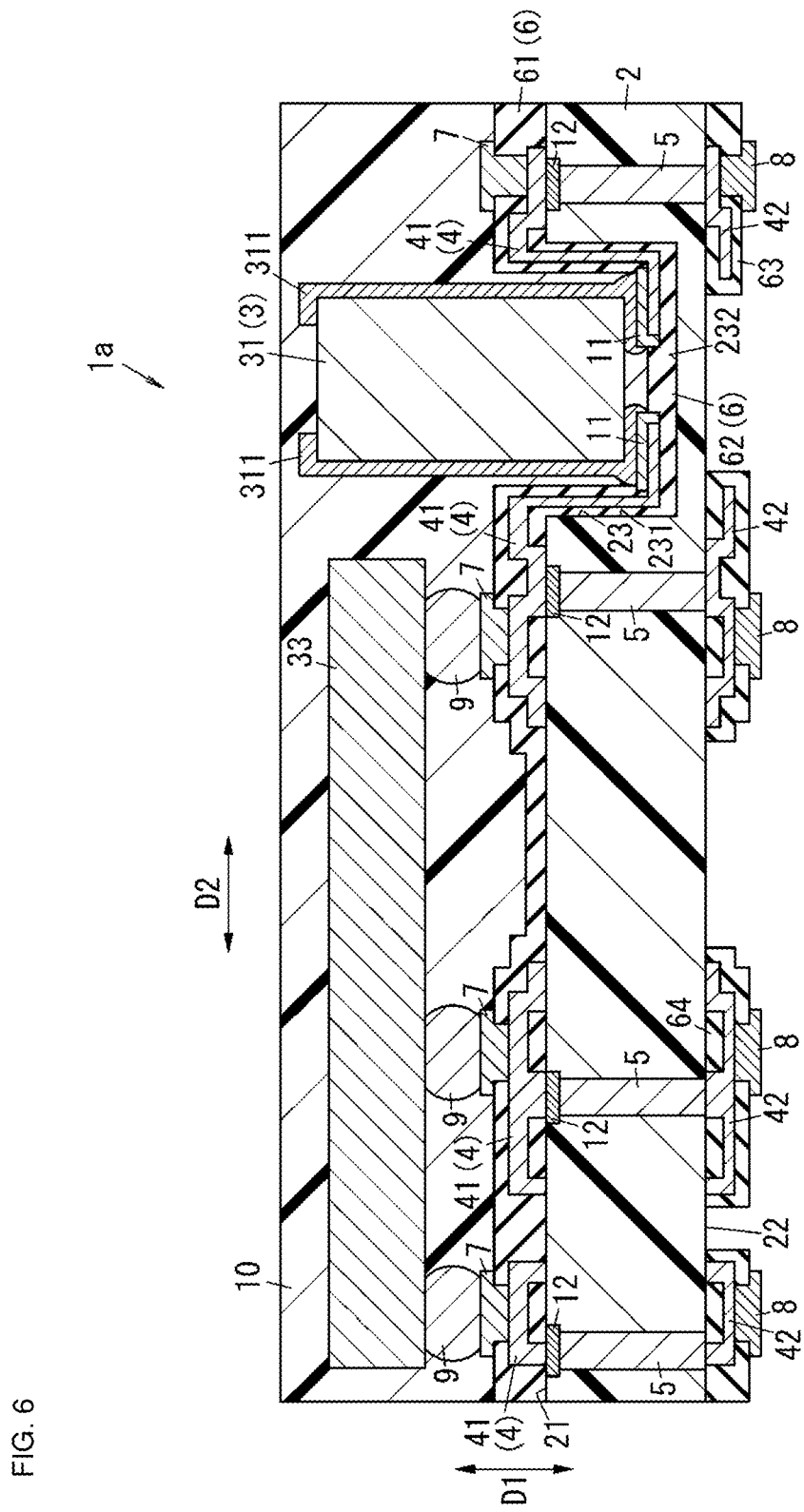
FIG. 6 is a sectional view of an electronic component module according to a second modified example of a preferred embodiment of the present invention.

As illustrated in FIG. 1, the electronic component module 1 according to the present preferred embodiment includes the second electronic component 32 which is built in the resin structure 2. As illustrated in FIG. 6, the second electronic component 32 is not necessarily built in the resin structure 2. An electronic component module 1a according to a second modified example will be described below by referring to FIG. 6. Components of the electronic component module 1a according to the second modified example, which are the same or substantially the same as those in the electronic component module 1 according to the present preferred embodiment, are designated with the same reference numerals, and will not be described.

As illustrated in FIG. 6, the electronic component module 1a according to the second modified example includes the resin structure 2, the first electronic component 31 serving as the electronic component 3, the third electronic component 33, the first wiring layers 41 defining and functioning as the wiring layer 4, and the second wiring layers 42. The electronic component module 1a according to the second modified example further includes the columnar electrodes 5, the first insulating layer 61 and the second insulating layer 62 which define and function as the insulating layer 6, portions of the third insulating layer 63, and portions of the fourth insulating layer 64. The electronic component module 1a according to the second modified example further includes the first terminal electrodes 7, the second terminal electrodes 8, and the protective layer 10. That is, compared with the electronic component module 1 according to the present preferred embodiment, the electronic component module 1a according to the second modified example does not include the second electronic component 32 and the fourth electronic component 34.

In the method of manufacturing the electronic component module 1 according to the second modified example, in the second process, the process, in which the second electronic component 32 and the fourth electronic component 34 are disposed on the temporary fixing member 14, is skipped. The processes other than this are the same or substantially the same as those for the electronic component module 1a according to the preferred embodiment, and will not be described.

As in the electronic component module 1 according to the present preferred embodiment, the electronic component module 1a according to the second modified example includes the resin structure 2 including the recess 23 for disposing the electronic component 3. This provides an advantage that, even when a stress is applied to the electronic component 3, which is disposed in the recess 23 of the resin structure 2, for example, in the thickness direction D1 of the resin structure 2, the resin structure 2 is difficult to break.

As in the method of manufacturing the electronic component module 2 according to the present preferred embodiment, the method of manufacturing the electronic component module 1a according to the first modified example includes the recess forming step. Therefore, all of the recess 23 is formed of the resin structure 2 which is an integral resin molded body. This provides an advantage that, for example, in formation of the protective layer 10 on the resin structure 2, even when a stress is applied to the electronic component 3 mounted in the recess 23 of the resin structure 2, the resin structure 2 is difficult to break.

(5.3) Third Modified Example

Figure 7:
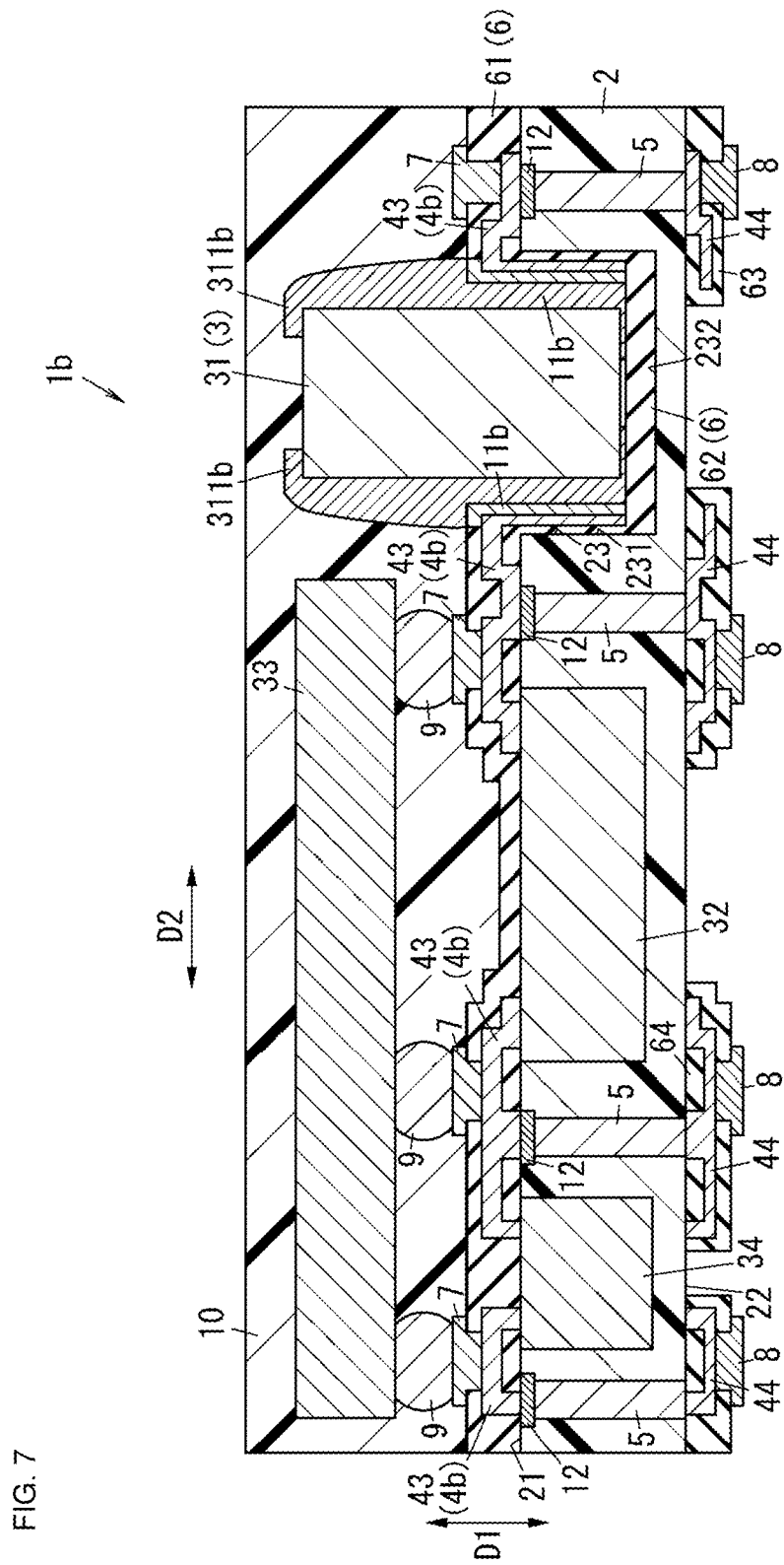
FIG. 7 is a sectional view of an electronic component module according to a third modified example of a preferred embodiment of the present invention.

In the electronic component module 1 according to the present preferred embodiment, as illustrated in FIG. 1, the first electronic component 31 is electrically connected to the first wiring layers 41 (wiring layer 4) through the second conductive portions of the conductive portions 311 which are disposed along the bottom surface of the first electronic component 31. In contrast, as illustrated in FIG. 7, the first electronic component 31 may be electrically connected to first wiring layers 43 (a wiring layer 4b) through conductive portions 311b disposed along the side surfaces of the first electronic component 31. An electronic component module 1b according to a third modified example will be described below by referring to FIG. 7. Components of the electronic component module 1b according to the third modified example, which are the same or substantially the same as those of the electronic component module 1 according to the preferred embodiment, are designated with the same reference numerals, and will not be described.

As illustrated in FIG. 7, the electronic component module 1b according to the third modified example includes the resin structure 2, the first electronic component 31 defining and functioning as the electronic component 3, the second electronic component 32, the third electronic component 33, the fourth electronic component 34, the first wiring layers 43 defining and functioning as the wiring layer 4b, and second wiring layers 44. The electronic component module 1b according to the third modified example further includes the columnar electrodes 5, the first insulating layer 61 and the second insulating layer 62 which define and function as the insulating layer 6, portions of the third insulating layer 63, and portions of the fourth insulating layer 64. The electronic component module 1b according to the third modified example further includes the first terminal electrodes 7, the second terminal electrodes 8, and the protective layer 10.

The first electronic component 31 is electrically connected to the conductive portions 311b. The conductive portions 311b are disposed along the respective side surfaces of the first electronic component 31. In contrast, among the first wiring layers 43, those corresponding to the first electronic component 31 are disposed on the first principal surface 21 of the resin structure 2 and on the side surfaces 231 of the recess 23 which connect with the first principal surface 21. That is, the first wiring layers 43 are integrally provided from the first principal surface 21 to the side surfaces 231 of the recess 23. The first electronic component 31 is electrically connected to the corresponding first wiring layers 43 of the first wiring layers 43 through conductive body portions 11b disposed along the side surfaces 231 of the recess 23 of the resin structure 2.

The method of manufacturing the electronic component module 1b according to the third modified example is different from the method of manufacturing the electronic component module 1 according to the present preferred embodiment in the following single point: the connection position between the first electronic component 31 and the first wiring layers 41 (or the first wiring layers 43) is different. Other than this, the same processes (the first to thirteenth processes) are performed to form the electronic component module 1 (or 1b).

As in the electronic component module 1 according to the present preferred embodiment, the electronic component module 1b according to the third modified example includes the resin structure 2 including the recess 23 for disposing the electronic component 3. This provides an advantage that, even when a stress is applied to the electronic component 3, which is disposed in the recess 23 of the resin structure 2, for example, in the thickness direction D1 of the resin structure 2, the resin structure 2 is difficult to break.

As in the method of manufacturing the electronic component module 1 according to the present preferred embodiment, the method of manufacturing the electronic component module 1b according to the third modified example includes the recess forming step. Therefore, all of the recess 23 is formed by using the resin structure 2 which is an integral resin molded body. This provides an advantage that, for example, in formation of the protective layer 10 on the resin structure 2, even when a stress is applied to the electronic component 3 mounted in the recess 23 of the resin structure 2, the resin structure 2 is difficult to break.

(5.4) Other Modified Examples

Other modified examples will be described below.

In the electronic component module 1 according to the present preferred embodiment, both of the first insulating layer and the second insulating layer 62 are included in the insulating layer 6. Alternatively, any structure may be provided as long as at least one of the insulating layers, the first insulating layer 61 and the second insulating layer 62, is included in the insulating layer 6. That is, at least one of the insulating layers, the first insulating layer 61 and the second insulating layer 62, may be omitted.

The electronic component module 1 according to the present preferred embodiment includes the first to fourth electronic components 31 to 34. Alternatively, the electronic component module 1 may have any structure as long as at least the first electronic component 31 is included. That is, the second to fourth electronic components 32 to 34 may be omitted.

In the electronic component module 1 according to the present preferred embodiment, the first electronic component 31 and the third electronic component 33 are covered by the protective layer 10. Alternatively, the first electronic component 31 and the third electronic component 33 are not necessarily covered by the protective layer 10.

In the method of manufacturing the electronic component module 1 according to the present preferred embodiment, in the first process, the temporary fixing member 14 is formed on the first support 13. Alternatively, the temporary fixing member 14 may be omitted.

In the electronic component module 1 according to the present preferred embodiment, the insulating layer 6 is provided on the first principal surface 21 of the resin structure 2, on the side surfaces 231 of the recess 23, and on the bottom surface 232 of the recess 23. Alternatively, any structure may be provided as long as the insulating layer 6 is provided at least on the first principal surface 21 of the resin structure 2 and the side surfaces 231 of the recess 23.

In the electronic component module 1 according to the present preferred embodiment, the first end surfaces of the columnar electrodes 5 are covered by the respective conductive portions 12. Alternatively, the conductive portions 12 may be omitted.

In the method of manufacturing the electronic component module 1 according to the present preferred embodiment, the material of the sacrificial body 15 is different from that of the resin structure 2. Alternatively, the material of the sacrificial body 15 may be the same or substantially the same as that of the resin structure 2.

Aspects described below are disclosed based on preferred embodiments of the present invention and the like described above.

A method of manufacturing an electronic component module (1; 1a; 1b) according to a preferred embodiment of the present invention includes a sacrificial-body arrangement step, a resin molding step, a recess forming step, and a wiring-layer forming step, and a component mounting step. In the sacrificial-body arrangement step, a sacrificial body (15) is disposed on a first principal surface (131) of a support (13). The support (13) includes the first principal surface (131) and a second principal surface (132). The sacrificial body (15) is smaller than the first principal surface (131) when viewed in the thickness direction of the support (13). In the resin molding step, a resin structure (2) is molded on the first principal surface (131) so as to cover the sacrificial body (15) disposed on the first principal surface (131). In the recess forming step, a recess (23) is formed in the resin structure (2) by removing the sacrificial body (15). In the wiring-layer forming step, a wiring layer (4; 4b) is formed on a side surface (231) of the recess (23) and on a principal surface (21) of the resin structure (2) which connects with the side surface (231). In the component mounting step, an electronic component (3) is mounted in the recess (23).

The structure described above provides an advantage that, even when a stress is applied to the electronic component (3), the resin structure (2) is difficult to break.

In a recess forming step in a method of manufacturing the electronic component module (1; 1a; 1b) according to a preferred embodiment of the present invention, the sacrificial body (15) is removed through etching.

This facilitates formation of the recess (23).

A method of manufacturing the electronic component module (1; 1b) according to a preferred embodiment of the present invention further includes a second-component arrangement step. In the second-component arrangement step, a second electronic component (32) is disposed on the first principal surface (131) before the resin molding step so as not to overlap the sacrificial body (15) in the thickness direction of the support (13). The second electronic component (32) is smaller than the first principal surface (131) when viewed in the thickness direction of the support (13). The second electronic component (32) is different from a first electronic component (31). In the resin molding step, the resin structure (2) is molded so as to cover the sacrificial body (15) and the second electronic component (32) which are disposed on the first principal surface (131).

This achieves a highly-integrated electronic component module (1; 1b).

A method of manufacturing the electronic component module (1; 1b) according to a preferred embodiment of the present invention further includes a third-component arrangement step. In the third-component arrangement step, a third electronic component (33) is disposed on the principal surface (21) so as not to overlap the first electronic component (31) in the thickness direction (D1) of the resin structure (2). The third electronic component (33) is different from the first electronic component (31) and the second electronic component (32).

This achieves a highly-integrated electronic component module (1; 1b).

A method of manufacturing the electronic component module (1; 1a; 1b) according to a preferred embodiment of the present invention further includes an insulating-layer forming step. In the insulating-layer forming step, an insulating layer (6) is formed at least on the principal surface (21) and the side surface (231) of the recess (23).

This provides an advantage that the insulating layer (6) is difficult to break.

A method of manufacturing the electronic component module (1; 1a; 1b) according to a preferred embodiment of the present invention further includes an electrode forming step. In the electrode forming step, a columnar electrode (5) is formed on the first principal surface (131) before the resin molding step.

This achieves a reduction in size of the electronic component module (1; 1a; 1b).

In a method of manufacturing the electronic component module (1; 1a) according to a preferred embodiment of the present invention, in the wiring-layer forming step, the wiring layer (4) is formed on the principal surface (21), on the side surface (231) of the recess (23), and on the bottom surface (232) of the recess (23).

This provides an advantage that the wiring layer (4) is difficult to break.

In a method of manufacturing the electronic component module (1; 1a; 1b) according to a preferred embodiment of the present invention, the material of the sacrificial body (15) is different from that of the resin structure (2).

This provides an advantage that, when the sacrificial body (15) is removed through etching, the resin structure (2) hardly receives influence from the etching.

An electronic component module (1; 1a; 1b) according to a preferred embodiment of the present invention includes a resin structure (2), an electronic component (3), and a wiring layer (4; 4b). The resin structure (2) includes a principal surface (21) in which a recess (23) is provided. The electronic component (3) is disposed in the recess (23). The wiring layer (4; 4b) is provided on the principal surface (21) and on a side surface (231) of the recess (23) which connects with the principal surface (21). The wiring layer (4; 4b) is electrically connected to the electronic component (3).

This provides an advantage that, even when a stress is applied to the electronic component (3), the resin structure (2) is difficult to break.

An electronic component module (1; 1a; 1b) according to a preferred embodiment of the present invention further includes a columnar electrode (5). The columnar electrode (5) extends through the resin structure (2) in the thickness direction (D1) of the resin structure (2).

This achieves a reduction in size of the electronic component module (1; 1a; 1b).

In an electronic component module (1; 1a) according to a preferred embodiment of the present invention, the wiring layer (4) is provided on the principal surface (21), on the side surface (231) of the recess (23), and on the bottom surface (232) of the recess (23).

This provides an advantage that the wiring layer (4) is difficult to break.

An electronic component module (1; 1a; 1b) according to a preferred embodiment of the present invention further includes an insulating layer (6). The insulating layer (6) is provided at least on the principal surface (21) and the side surface (231) of the recess (23).

This provides an advantage that the insulating layer (6) is difficult to break.

An electronic component module (1; 1b) according to a preferred embodiment of the present invention further includes a second electronic component (32). The second electronic component (32) is different from a first electronic component (31) defining and functioning as the electronic component (3). The second electronic component (32) is built in the resin structure (2) at a position at which the second electronic component (32) does not overlap the first electronic component (31) in the thickness direction (D1) of the resin structure (2).

This achieves a highly-integrated electronic component module (1; 1b).

An electronic component module (1; 1b) according to a preferred embodiment of the present invention further includes a third electronic component (33). The third electronic component (33) is different from the first electronic component (31) and the second electronic component (32). The third electronic component (33) is disposed on the principal surface (21) so as not to overlap the first electronic component (31) in the thickness direction (D1) of the resin structure (2).

This achieves a highly-integrated electronic component module (1; 1b).

In an electronic component module (1; 1b) according to a preferred embodiment of the present invention, the height (H1) of the first electronic component (31) is greater than the height (H2) of the third electronic component (33) in the thickness direction (D1) of the resin structure (2).

This achieves a reduction in profile of the electronic component module (1; 1b) due to the arrangement of the first electronic component (31) in the recess (23).

In an electronic component module (1; 1a; 1b) according to a preferred embodiment of the present invention, the height (H1) of the first electronic component (31) is greater than the height of the recess (23) in the thickness direction (D1) of the resin structure (2).

This achieves a reduction in profile of the electronic component module (1; 1a; 1b) due to the arrangement of the first electronic component (31) in the recess (23).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing an electronic component module, the method comprising:
   a sacrificial-body arrangement step of disposing a sacrificial body on a first principal surface of a support, the support including the first principal surface and a second principal surface, the sacrificial body being smaller than the first principal surface when viewed in a thickness direction of the support;
   a resin molding step of molding a resin structure on the first principal surface so as to cover the sacrificial body disposed on the first principal surface;
   a recess forming step of forming a recess in the resin structure by removing the sacrificial body;
   a wiring-layer forming step of forming a wiring layer on a side surface of the recess and on a principal surface of the resin structure, the principal surface connecting with the side surface; and
   a component mounting step of mounting an electronic component in the recess; wherein
   a height of the electronic component is greater than a height of the recess in a thickness direction of the resin structure.

2. The method of manufacturing an electronic component module according to claim 1, wherein, in the recess forming step, the sacrificial body is removed by etching.

3. The method of manufacturing an electronic component module according to claim 1, further comprising:
   a second-component arrangement step of disposing a second electronic component on the first principal surface before the resin molding step so as not to overlap the sacrificial body in the thickness direction of the support, the second electronic component being different from a first electronic component defining and functioning as the electronic component, the second electronic component being smaller than the first principal surface when viewed in the thickness direction of the support; wherein
   in the resin molding step, the resin structure is molded so as to cover the sacrificial body and the second electronic component, the sacrificial body and the second electronic component being disposed on the first principal surface.

4. The method of manufacturing an electronic component module according to claim 3, further comprising:
a third-component arrangement step of disposing a third electronic component on the first principal surface so as not to overlap the first electronic component in a thickness direction of the resin structure, the third electronic component being different from the first electronic component and the second electronic component.

5. The method of manufacturing an electronic component module according to claim 1, further comprising an insulating-layer forming step of forming an insulating layer at least on the principal surface of the resin structure and the side surface of the recess.

6. The method of manufacturing an electronic component module according to claim 1, further comprising an electrode forming step of forming a columnar electrode on the first principal surface before the resin molding step.

7. The method of manufacturing an electronic component module according to claim 1, wherein, in the wiring-layer forming step, the wiring layer is formed on the principal surface of the resin structure, on the side surface of the recess, and on a bottom surface of the recess.

8. The method of manufacturing an electronic component module according to claim 1, wherein a material of the sacrificial body is different from a material of the resin structure.

9. The method of manufacturing an electronic component module according to claim 1, wherein the resin structure is made of epoxy resin.

10. The method of manufacturing an electronic component module according to claim 1, wherein the wiring layer includes copper and at least one of chromium, nickel, iron, cobalt, or zinc added to the copper.

11. An electronic component module comprising:
a resin structure including a principal surface in which a recess is disposed;
an electronic component in the recess; and
a wiring layer on the principal surface and on a side surface of the recess, the side surface connecting with the principal surface, and that is electrically connected to the electronic component; wherein
a height of the electronic component is greater than a height of the recess in a thickness direction of the resin structure.

12. The electronic component module according to claim 11, further comprising a columnar electrode extending through the resin structure in a thickness direction of the resin structure.

13. The electronic component module according to claim 11, wherein the wiring layer is provided on the principal surface, on the side surface of the recess, and on a bottom surface of the recess.

14. The electronic component module according to claim 11, further comprising an insulating layer at least on the principal surface and the side surface of the recess.

15. The electronic component module according to claim 11, further comprising:
a second electronic component that is different from a first electronic component defining and functioning as the electronic component; wherein
the second electronic component is built in the resin structure at a position at which the second electronic component does not overlap the first electronic component in a thickness direction of the resin structure.

16. The electronic component module according to claim 15, further comprising:
a third electronic component that is different from the first electronic component and the second electronic component; wherein
the third electronic component is disposed on the principal surface so as not to overlap the first electronic component in the thickness direction of the resin structure.

17. The electronic component module according to claim 16, wherein the height of the first electronic component is greater than a height of the third electronic component in the thickness direction of the resin structure.

18. The electronic component module according to claim 11, wherein the resin structure is made of epoxy resin.

19. The electronic component module according to claim 11, wherein the wiring layer includes copper and at least one of chromium, nickel, iron, cobalt, or zinc added to the copper.

* * * * *